(12) United States Patent
Su et al.

(10) Patent No.: US 9,543,417 B2
(45) Date of Patent: Jan. 10, 2017

(54) HIGH MOBILITY DEVICES AND METHODS OF FORMING SAME

(71) Applicant: Taiwan Semiconductor Manufacturing Company, Ltd., Hsin-Chu (TW)

(72) Inventors: Huan-Chieh Su, Tianzhong Township (TW); Cheng-Long Chen, Hsin-Chu (TW); Ching-Hong Jiang, Hsin-Chu (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 18 days.

(21) Appl. No.: 14/536,119

(22) Filed: Nov. 7, 2014

(65) Prior Publication Data
US 2016/0133746 A1 May 12, 2016

(51) Int. Cl.
*H01L 21/8234* (2006.01)
*H01L 29/66* (2006.01)

(52) U.S. Cl.
CPC .............................. *H01L 29/66795* (2013.01)

(58) Field of Classification Search
CPC .......... H01L 21/823431; H01L 21/845; H01L 21/823821
See application file for complete search history.

(56) References Cited

U.S. PATENT DOCUMENTS

| | | | |
|---|---|---|---|
| 2008/0060525 A1* | 3/2008 | Lee | B01D 19/0036 96/180 |
| 2012/0220206 A1* | 8/2012 | Borucki | B24B 57/02 451/446 |
| 2014/0015107 A1* | 1/2014 | Chen | B24B 37/015 257/618 |
| 2014/0145247 A1* | 5/2014 | Cheng | H01L 29/66545 257/288 |
| 2014/0145248 A1* | 5/2014 | Cheng | H01L 21/02227 257/288 |
| 2014/0252483 A1* | 9/2014 | Nagumo | H01L 21/845 257/351 |
| 2015/0076514 A1* | 3/2015 | Morin | H01L 29/7843 257/77 |

(Continued)

*Primary Examiner* — Jae Lee
(74) *Attorney, Agent, or Firm* — Slater Matsil, LLP

(57) ABSTRACT

An embodiment method includes forming a first fin and a second fin over a semiconductor substrate. The first fin includes a first semiconductor strip of a first type, and the second fin includes a second semiconductor strip of the first type. The method further includes replacing the second semiconductor strip with a third semiconductor strip of a second type different than the first type. Replacing the second semiconductor strip includes masking the first fin using a barrier layer while replacing the second semiconductor strip and performing a chemical mechanical polish (CMP) on the third semiconductor strip using a slurry that planarizes the third semiconductor strip at a faster rate than the barrier layer. In some embodiments, the method may further include depositing a sacrificial layer over a wafer containing the first and second fins and performing a non-selective CMP to substantially level a top surface of the wafer.

20 Claims, 10 Drawing Sheets

(56) References Cited

U.S. PATENT DOCUMENTS

2015/0159300 A1* 6/2015 Cho ................. C30B 28/02
257/40
2015/0343604 A1* 12/2015 Kimura ............. B24B 37/24
51/296

* cited by examiner

HIGH MOBILITY DEVICES AND METHODS OF FORMING SAME

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits typically include field-effect transistors (FETs).

Conventionally, planar FETs have been used in integrated circuits. However, with the ever increasing density and decreasing footprint requirements of modern semiconductor processing, planar FETs may generally incur problems when reduced in size. Some of these problems include sub-threshold swing degradation, significant drain induced barrier lowering (DIBL), fluctuation of device characteristics, and leakage. Fin field-effect transistors (finFETs) have been studied to overcome some of these problems.

In a typical finFET, a vertical fin structure is formed over a substrate. This vertical fin structure is used to form source/drain regions in the lateral direction and a channel region in the fin. A gate is formed over the channel region of the fin in the vertical direction forming a finFET. Subsequently, an inter-layer dielectric (ILD) and a plurality of interconnect layers may be formed over the finFET.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
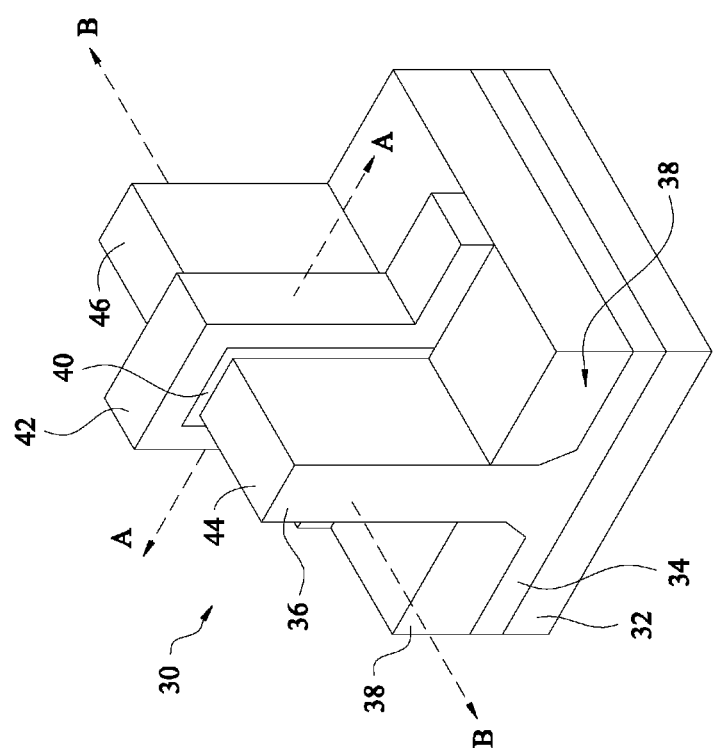
FIG. 1 is an example of a Fin Field-Effect Transistor (finFET) in a three-dimensional view.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include a method for forming finFETs of two different types (e.g., n-type and p-type) over a strain relaxed buffer (SRB) layer and a corresponding structure. The process for forming the finFETs may include growing a first semiconductor layer of a first type (e.g., n-type or p-type) over a SRB layer and replacing a first portion of the first semiconductor layer of the first type with a second semiconductor layer of a second type (e.g., the other of n-type or p-type). The process may include using various barrier and/or sacrificial layers to protect the second portion of the first semiconductor layer while the second semiconductor layer is formed. The process may further include using various selective etching and/or planarization processes in combination with the barrier and/or sacrificial layers.

FIG. 1 illustrates an example of a finFET 30 in a three-dimensional view. FinFET 30 includes a strain relaxed buffer (SRB) 34 and fin 36 on a substrate 32. FinFET 30 may further include isolation regions 38, and fin 36 protrudes above and from between neighboring isolation regions 38. A gate dielectric 40 extends along sidewalls and over a top surface of the fin 36, and a gate electrode 42 is disposed over the gate dielectric 40. Source/drain regions 44 and 46 are disposed in opposite sides of the fin 36 with respect to the gate dielectric 40 and gate electrode 42. FIG. 1 further illustrates reference cross-sections that are used in later figures. Cross-section A-A is across a channel, gate dielectric 40, and gate electrode 42 of the finFET 30. Cross-section B-B is perpendicular to cross-section A-A and is along a longitudinal axis of the fin 36 and in a direction of, for example, a current flow between the source/drain regions 44 and 46. Subsequent figures may refer to these reference cross-sections for clarity.

Figure 17:
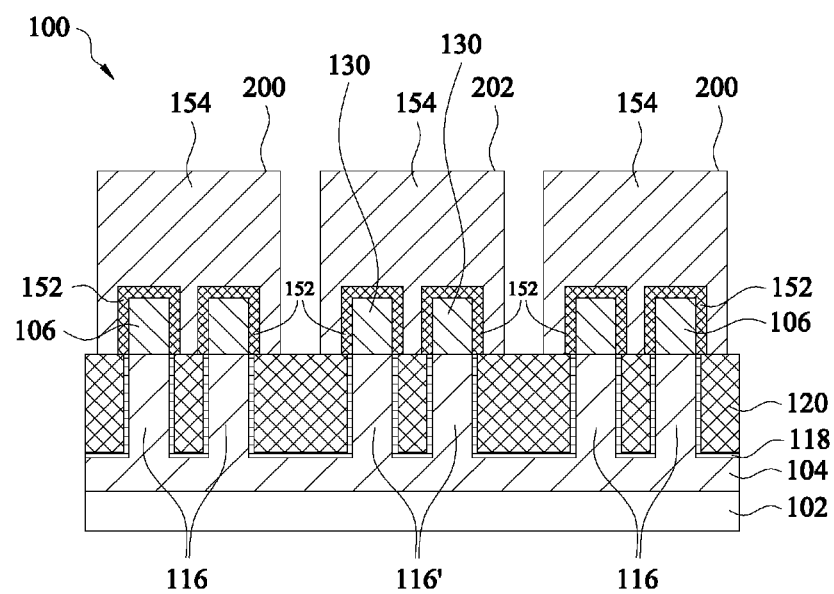
Figure 18:
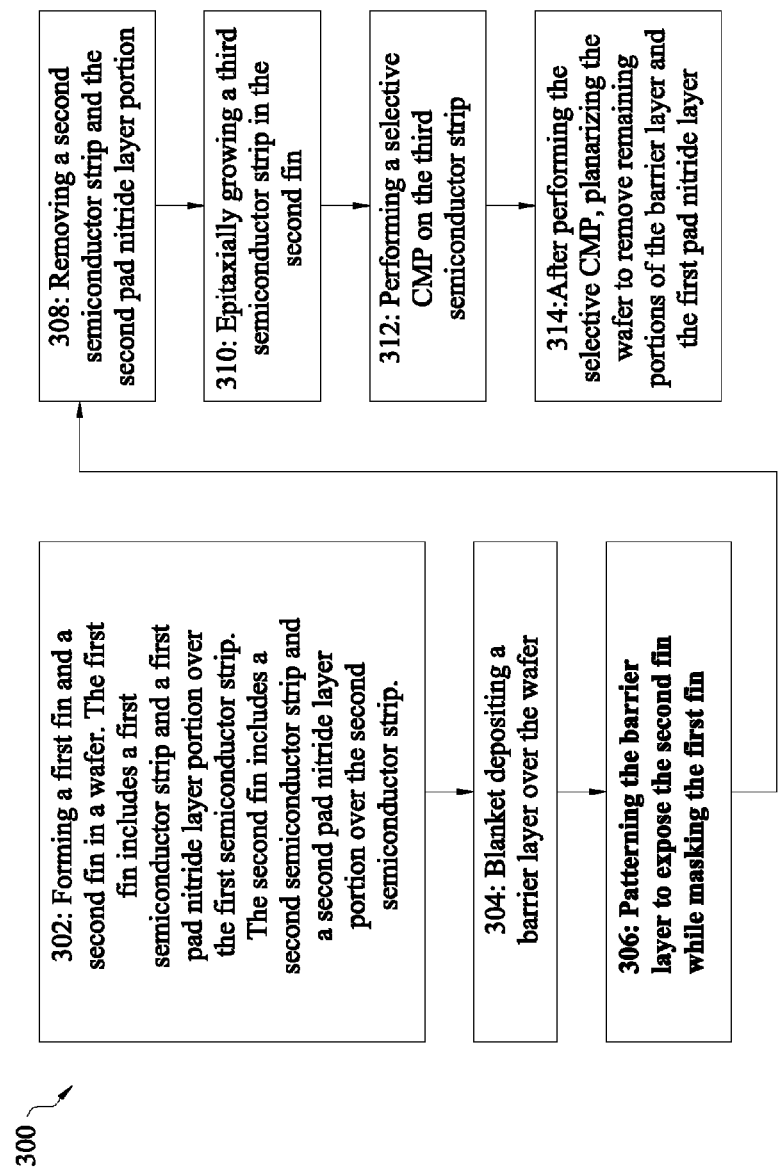
FIG. 18 illustrates a flow diagram of a method for manufacturing a finFET in accordance with some embodiments.

FIGS. 2 through 17 are cross-sectional views of various intermediary stages in the manufacturing finFETs in accordance with various embodiments, and FIG. 18 is a process flow of the process shown in FIGS. 2 through 17. FIGS. 2 through 17 illustrate reference cross-section A-A illustrated in FIG. 1, except for multiple finFETs and/or finFETs having multiple fins.

Figure 2:
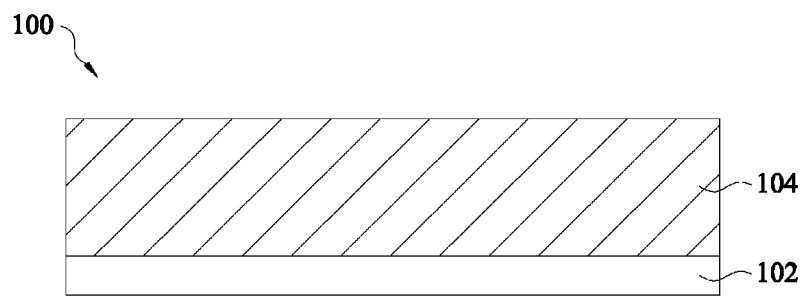
FIGS. 2 through 17 illustrate cross-sectional views of intermediary stages of the manufacturing a finFET in accordance with some embodiments.
Figure 3:
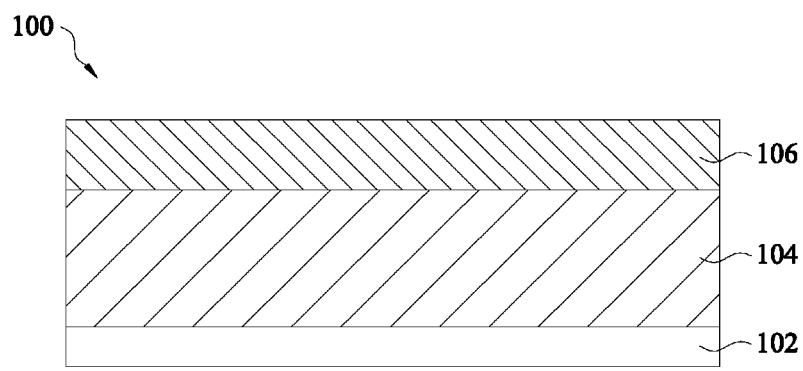

FIGS. 2 and 3 illustrate the formation of semiconductor regions over a substrate. Referring first to FIG. 2, a wafer 100 having a substrate 102 is illustrated. Substrate 102 may be a semiconductor substrate, such as a bulk semiconductor, a semiconductor-on-insulator (SOI) substrate, or the like, which may be doped (e.g., with a p-type or an n-type dopant) or undoped. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of substrate 102 may include silicon (Si); germanium (Ge); a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

As further illustrated by FIGS. 2 and 3, additional semiconductor layers may be formed over substrate 102. In some embodiments, a one or more epitaxies may be performed to form a strain relax buffer (SRB) layer 104 over substrate 102 (see FIG. 2) and a semiconductor layer 106 of a first type over SRB layer 104 (see FIG. 3). Any suitable epitaxy processes may be used, such as by metal-organic (MO) chemical vapor deposition (CVD), molecular beam epitaxy (MBE), liquid phase epitaxy (LPE), vapor phase epitaxy (VPE), selective epitaxial growth (SEG), combinations thereof, or the like.

In some embodiments, SRB layer 104 and semiconductor layer 106 may comprise Si, SiGe, or Ge having differing atomic percentages of Ge. SRB layer 104 may be substantially relaxed when the material of the SRB layer 104 is lattice mismatched to the material underlying SRB layer 104, such as the material of the substrate 102. SRB layer 104 may be substantially relaxed through plastic relaxation by dislocations being generated in SRB layer 104 and/or through elastic relaxation. SRB layer 104 may further induce a strain in an overlying material, such as the upper semiconductor layer 106. When a relaxed layer, such as a SRB layer 104, is lattice mismatched with an overlying layer, such as semiconductor layer 106, the overlying layer may be strained through pseudomorphic epitaxial growth. The type of strain in the overlying semiconductor layer 106 (e.g., compressive strain or tensile strain) may vary depending on whether n-type or p-type devices are desired, and the type of strain achieved may be adjusted by selecting a suitable atomic percentage of Ge in SRB layer 104 and semiconductor layer 106.

For example, for n-type devices, tensile strain may be desirable. In such embodiments, SRB layer 104 may comprise a higher atomic percentage of Ge than semiconductor layer 106. For example, SRB layer 104 may comprise SiGe having about 25% to about 50% Ge while overlying semiconductor layer 106 may comprise SiGe or Si having about 0% to about 25% Ge. In alternative embodiments, an SRB layer 104 comprising SiGe having about 50% to about 75% Ge and a semiconductor layer 106 comprising SiGe having about 25% to about 50% Ge may also be used to achieve tensile strain in semiconductor layer 106. Other material combinations (e.g., having other semiconductor materials and/or other atomic percentages of germanium) may also achieve a tensile strain in semiconductor layer 106.

In other embodiments, semiconductor layer 106 may be compressively strained, which may be advantageous for p-type devices. In such embodiments, SRB layer 104 may comprise a lower atomic percentage of Ge than semiconductor layer 106. For example, SRB layer 104 may comprise SiGe having about 25% to about 50% Ge while overlying semiconductor layer 106 may comprise SiGe having about 50% to about 75% Ge. In alternative embodiments, an SRB layer 104 comprising SiGe having about 50% to about 75% Ge and a semiconductor layer 106 comprising SiGe or pure Ge having about 75% to about 100% Ge may also be used to achieve compressive strain in semiconductor layer 106. Other material combinations (e.g., having other semiconductor materials and/or other atomic percentages of germanium) may also achieve a compressive strain in semiconductor layer 106.

Figure 4:
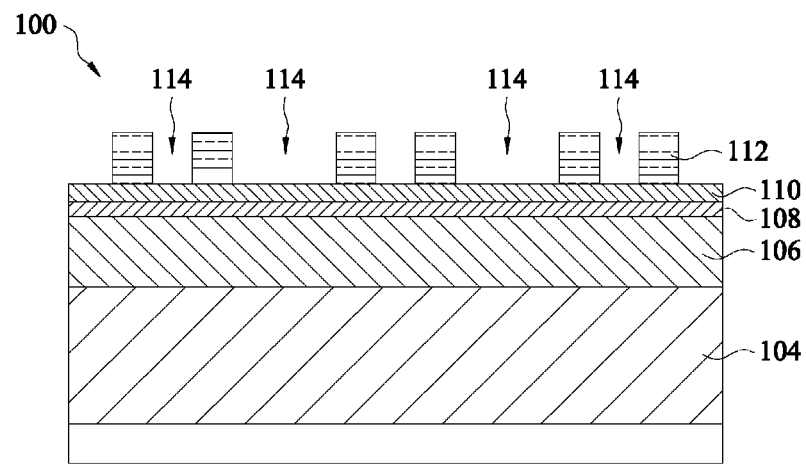
Figure 5:
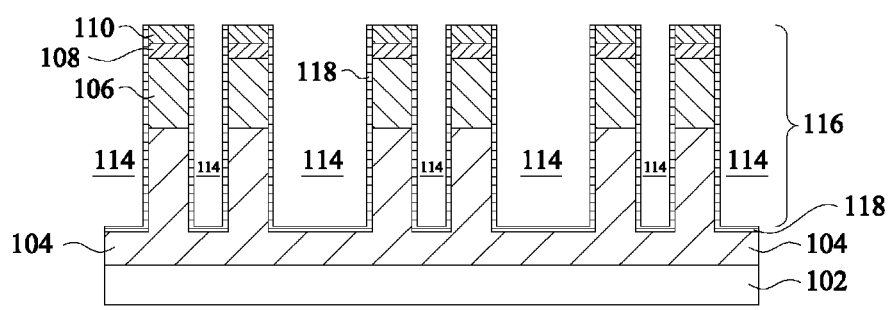
Figure 6:
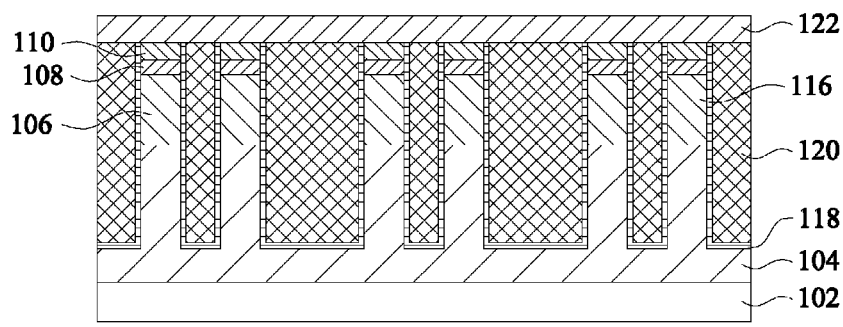

FIGS. 4 through 6 illustrate the formation of STI regions 120 in wafer 100. Referring first to FIG. 4, pad layers 108 and 110 may be disposed over semiconductor layer 106. Pad layer 108 may include an oxide (e.g., silicon oxide) while pad layer 110 may include a nitride (e.g., silicon nitride). Pad layers 110 and 108 may act as etch stop and/or protective layers for portions of semiconductor layer 106, SRB layer 104, and/or substrate 102 during the formation of additional features in wafer 100 in subsequent process steps.

As further illustrated by FIG. 4, a patterned photoresist 112 may be formed over pad layer 110. For example, photoresist 112 may be blanket deposited over pad layer 110 and exposed using a photomask. Exposed or unexposed portions of photoresist 112 may then be removed depending on whether a positive or negative resist is used. Thus, openings 114 may be formed in photoresist 112.

Subsequently, as illustrated by FIG. 5, openings 114 may be extended into SRB layer 104 by etching pad layer 110, pad layer 108, semiconductor layer 106, and SRB layer 104, for example. The etching may be any acceptable etch process, such as a reactive ion etch (RIE), neutral beam etch (NBE), the like, or a combination thereof. The etching may be anisotropic. Subsequently, photoresist 112 is removed in an ashing and/or wet strip processes, for example. In some embodiments, a hard mask (not shown) might be formed atop pad layer 110 prior to formation of photoresist 112, in which embodiments the pattern from photoresist 112 would first be imposed upon the hard mask and the patterned hard mask would be used in patterning the underlying layers 110, 108, 106, and 104.

Thus, fins 116 are formed in wafer 100. Fins 116 extend upwards from SRB layer 104 between adjacent openings 114. Each fin 116 includes a SRB layer 104 portion, a semiconductor layer 106 portion, an oxide pad layer 108 portion, and a nitride pad layer 110 portion. Solely for the ease of description, semiconductor layer 106 in wafer 100 will be described as an n-type semiconductor layer, which is tensilely strained and doped with n-type impurities as described above. Furthermore, after patterning fins 116, semiconductor layer 106 is patterned as individual semiconductor strips extending upwards from SRB layer 104. Thus, remaining portions of semiconductor layer 106 in fins 116 may be referred to as n-type semiconductor strips 106 hereinafter. However, one or ordinary skill in the art would recognize that various embodiments may apply to alternative structures where semiconductor layer 106 is a p-type layer.

As further illustrated by FIG. 5, a liner 118, such as a diffusion barrier layer, may be disposed along sidewalls of bottom surfaces of openings 114. In some embodiments, liner 118 may comprise a semiconductor (e.g., silicon) nitride, a semiconductor (e.g., silicon) oxide, a thermal semiconductor (e.g., silicon) oxide, a semiconductor (e.g., silicon) oxynitride, a polymer dielectric, combinations thereof, and the like formed using any suitable method, such as, atomic layer deposition (ALD), CVD, high density plasma (HDP) CVD, physical vapor deposition (PVD), and the like.

Referring next to FIG. 6, openings 114 may be filled with a dielectric material, such as, silicon oxide, or the like. In some embodiments, the resulting STI regions 120 may be formed using a high-density-plasma (HDP) CVD process, using silane ($SiH_4$) and oxygen ($O_2$) as reacting precursors. In other embodiments, STI regions 120 may be formed using a sub-atmospheric CVD (SACVD) process or high aspect-ratio process (HARP), wherein process gases may comprise tetraethylorthosilicate (TEOS) and ozone ($O_3$). In yet other embodiments, STI regions 120 may be formed using a spin-on-dielectric (SOD) process, such as hydrogen silsesquioxane (HSQ) or methyl silsesquioxane (MSQ). An annealing may be performed to cure the material of STI regions 120, and liner 118 may prevent (or at least reduce) the diffusion of semiconductor material from fins 116 (e.g., Si and/or Ge) into the surrounding STI regions 120 during the annealing. Other processes and materials may be used. A chemical mechanical polish (CMP) or etch back process may be used to level a top surface of the dielectric material of STI regions 120 using pad layer 110 (e.g., a nitride) as an etch stop layer. After planarization, top surfaces of fins 116 and STI regions 120 may be substantially level with each other. Furthermore, in embodiments where semiconductor layer 106 is tensilely strained, n-type anti-punch through (APT) impurities (e.g., boron or $BF_2$) may be implanted in semiconductor layer 106.

As further illustrated by FIG. 6, a barrier layer 122 may be formed over STI regions 120 and fins 116. In various embodiments, barrier layer 122 may be blanket deposited using any suitable process (e.g., CVD, and the like). Barrier layer 122 may act as a mask layer, an etch stop layer, and/or a protective layer for various underlying features during the formation of additional features in wafer 100 as will be explained in greater detail in subsequent paragraphs. In some embodiments, barrier layer 122 may comprise a different material than pad layer 110, which may allow for selective patterning of barrier layer 122 or pad layer 110. For example, when pad layer 110 comprises a nitride, barrier layer 122 may comprise an oxide (e.g., SiO, ALD OX, plasma enhanced oxide (PEOX)). In some embodiments, barrier layer 122 may have a thickness of about 15 nm to about 30 nm, for example.

Figure 7:
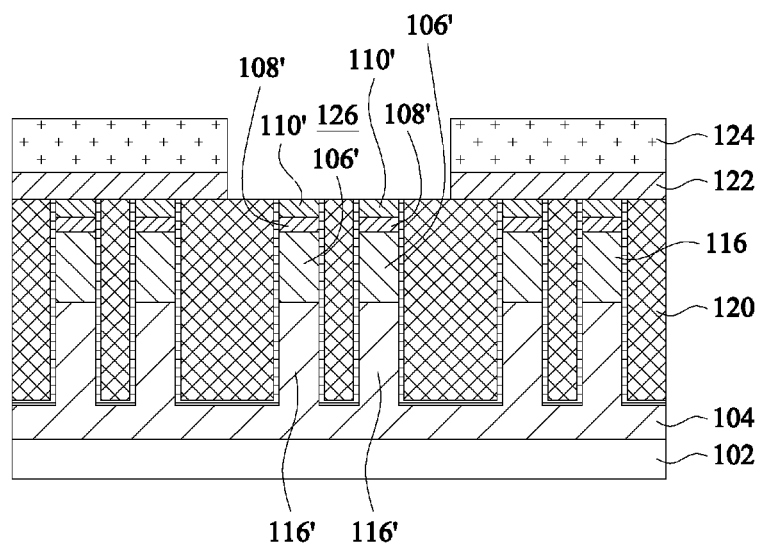

FIGS. 7 through 10 illustrate the removal of top portions of certain fins 116 (labeled 116'). Referring first to FIG. 7, barrier layer 122 is patterned using a combination of photolithography and etching, for example, to form an opening 126 extending through barrier layer 122. The patterning of barrier layer 122 may include using photoresist 124 as a patterning mask and an anisotropic etching process. Opening 126 may partially expose a top surface of STI regions 120 and top surfaces (e.g., pad layer portions 110') of semiconductor fins 116'. In such embodiments, pad layer portions 110' may act as an etch stop layer for the etching of barrier layer 122. The fins exposed by opening 126 may be one selected for the formation of finFETs of a different type (e.g., p-type) than n-type semiconductor strips 106. In alternative embodiments where semiconductor layer 106 is a p-type layer, n-type finFETs may be formed in fins 116'. Other fins 116 in wafer 100 may remained masked by barrier layer 122. Subsequently, photoresist 124 may be removed using a photoresist stripping solution, such as, "Caro's Solution" or "Caro's PR Solution," for example.

Figure 8:
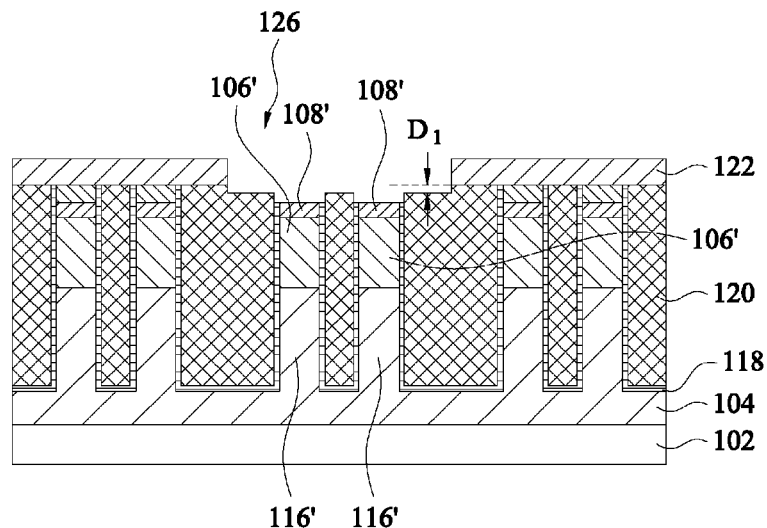

Next, in FIG. 8, pad layer portions 110' (e.g., a nitride) of fins 116' are removed using one or more etching processes, for example. The removal of pad layer portions 110' may include a dry etching process to break through a native oxide (not shown) formed on a top surface of exposed STI regions 120 followed by a dry etching to remove pad layer portions 110'. The removal of pad layer portions 110' may further use pad layer portions 108' (e.g., an oxide) as an etch stop layer.

As a result of break through etching, a top surface of STI regions 120 in opening 126 may be recessed by a distance D1 from a top surface of masked portions of STI regions 120. For example, barrier layer 122 may prevent damage to masked portions of STI regions 120 and fins 116 during the break through etching process. In various embodiments, the break through etching process may use a chemical etchant that selectively etches STI regions 120 at a higher rate than barrier layer 122. For example, a ratio of the etching rate of barrier layer 122 to the etching rate of STI regions 120 may be about 1:1.5. In such embodiments, barrier layer 122 may also be etched during the break through etching (not explicitly illustrated).

Figure 9:
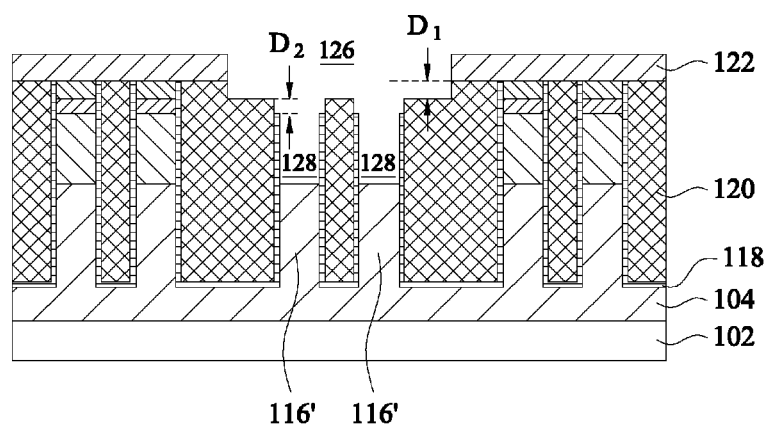

Referring next to FIG. 9, pad layer portions 108' and n-type semiconductor strips 106' of fins 116' are removed using one or more etching processes, for example. The removal of pad layer portions 108' (e.g., an oxide) may include a break through etching process, and subsequently, a channel recess (e.g., a dry or wet etching process) may be employed to remove n-type semiconductor strips 106'. The removal of pad layer portions 108' may comprise a similar process as the break through etching used to remove the native oxide (not shown) of exposed STI regions 120. In such embodiments, distance D1 may be increased during the removal of pad layer portions 108', and embodiments, barrier layer 122 may prevent damage to masked portions of STI regions 120 and fins 116 during the removal of pad layer portions 108'. The removal of pad layer portions 108' and n-type semiconductor strips 106' may further recess portions of liner 118 exposed by opening 126 (e.g., by a distance D2 in FIG. 9). In some embodiments (not illustrated), liner 118 may even be recessed past a top surface of SRB layer 104. Subsequently, an ashing process may be used to clean out byproducts of the etching processes (e.g., break through etching and/or channel recessing). Thus, trenches 128 are formed in wafer 100 disposed between neighboring STI regions 120. Trenches 128 may be connected to opening 126 and expose top surfaces of SRB layer 104 in fins 116'.

Figure 10:
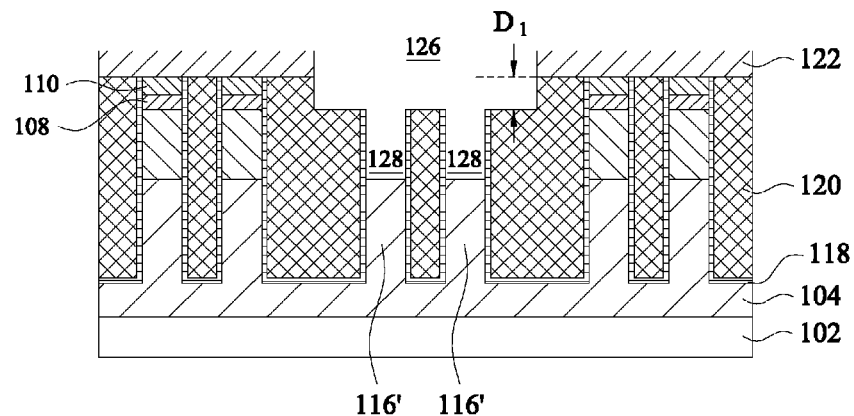

In FIG. 10, an epitaxial pre-cleaning is performed to remove a native oxide (not shown) formed on a top surface of SRB layer 104 in trenches 128. The pre-cleaning process may include using an HF-based gas or a SiCoNi-based gas, for example. As a result of pre-cleaning, a top surface of STI regions 120 in opening 126 may be recessed even further from a top surface of masked portions of STI regions 120 (e.g., D1 may be further increased).

As also illustrated by FIG. 10, liner 118 may substantially cover sidewalls of trenches 128. For example, top surfaces of liner 118 and STI regions 120 may be substantially level after the pre-cleaning process. Alternatively, liner 118 may be recessed from the top surface of SRB layer 104. In subsequent process steps (e.g., in FIG. 11), semiconductor strips 130 may be grown in trenches 128 on SRB layer 104. In embodiments where liner 118 is recessed, semiconductor strips 130 may be grown on multiple surfaces of SRB layer 104 (e.g., a lateral top surface and sidewall surfaces). This increased bonding area may reduce the occurrence of voids and other interface defects at the interface between SRB layer 104 and semiconductor strips 130.

Throughout the various etching and/or pre-cleaning processes illustrated by FIGS. 8 through 10, barrier layer 122 may prevent damage to masked portions of STI regions 120 and fins 116. As a result of various etching/pre-cleaning processes, barrier layer 122 may also be thinned. Thus, the deposition of barrier layer 122 may include depositing a sufficiently thick layer to withstand these various process steps. For example, barrier layer 122 may have an initial thickness (after deposition) of about 15 nm to about 30 nm.

Figure 11:
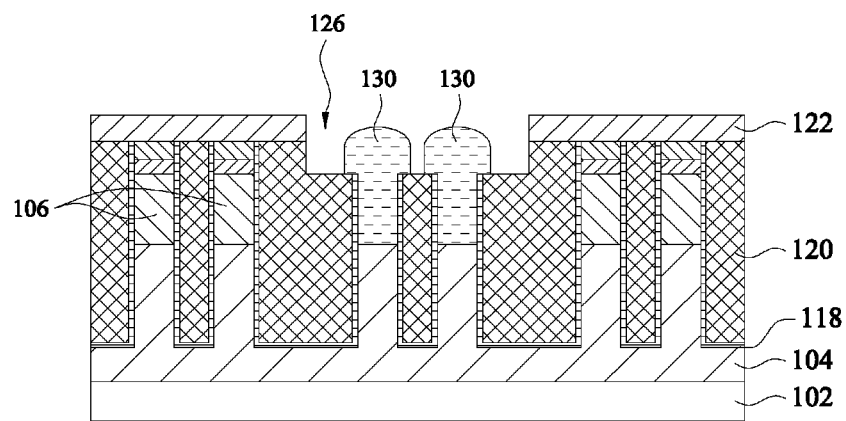

After pre-cleaning, in FIG. 11, an epitaxy is performed to epitaxially grow semiconductor strips 130 are formed in trenches 128. In various embodiments, semiconductor strips 130 may be of a different type than n-type semiconductor strips 106. For example, in wafer 100, semiconductor strips 130 may be p-type layer, and will be referred to as p-type semiconductor strips 130 hereinafter. Various embodiments may also be applied to structures where semiconductor layer 106 is p-type and semiconductor strips 130 are n-type. During the epitaxy of p-type semiconductor strips 130, a p-type APT impurity (e.g., phosphorus or arsenic) may be in-situ doped with the proceeding or the epitaxy. Furthermore, p-type semiconductor strips 130 may be compressively strained as described above.

Figure 12:
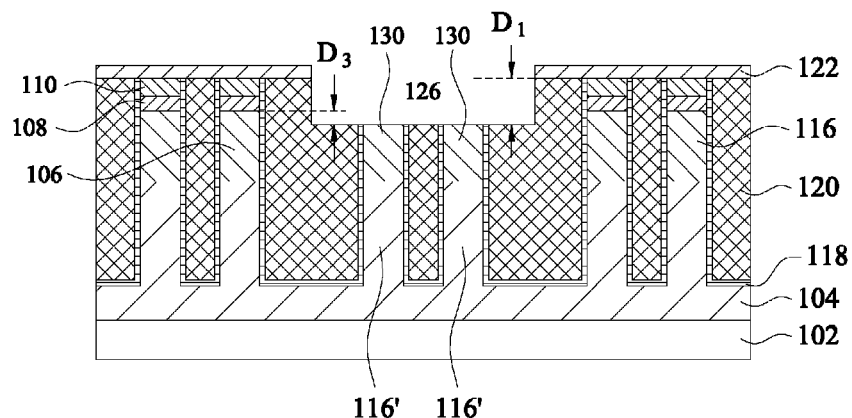

The epitaxy of p-type semiconductor strips 130 may overgrow trenches 128 and extend into opening 126. In FIG. 12, a high-selectively CMP may be used to remove such overgrown portions and planarize top surfaces of p-type semiconductor strips 130. For example, the CMP process may comprise using a chemical slurry that selectively removes the material of p-type semiconductor strips 130 (e.g., SiGe or Ge) at a higher rate than barrier layer 122 (e.g., an oxide) and/or STI regions 120. In some embodiments, the slurry may etch p-type semiconductor strips 130 at about five times (or even greater) a rate than barrier layer 122 and/or STI regions 120. After CMP, top surfaces of p-type semiconductor strips 130 and STI regions 120 in opening 126 may be substantially level. Furthermore, the selective CMP process may further recess or even remove barrier layer 122. In embodiments where barrier layer 122 is removed during the selective CMP, pad layers 108 and/or 110 may protect n-type semiconductor strips 106 from damage.

Exposed portions of STI regions 120 may also be recessed (e.g., distance D1 may be increased). For example, in FIG. 11, a total dimension of distance D1 as a result of various etching, pre-cleaning, and/or CMP processes may be about 20 nm or even more. As a further result of the various etching, pre-cleaning, and/or CMP processes used to form p-type semiconductor strips 130, top surfaces of p-type semiconductor strips 130 and n-type semiconductor strips 106 may not be substantially level. For example, a top surface of p-type semiconductor strips 130 may be recessed from a top surface of n-type semiconductor strips 106 by a distance D3. In some embodiments, D3 may be about 12 nm to about 22 nm, for example. Such a height variation between n-type semiconductor strips 106 and p-type semiconductor strips 130 may result in various manufacturing and/or device defects. Thus, additional processing may be used to further level top surfaces of n-type semiconductor strips 106 and p-type semiconductor strips 130.

Figure 13:
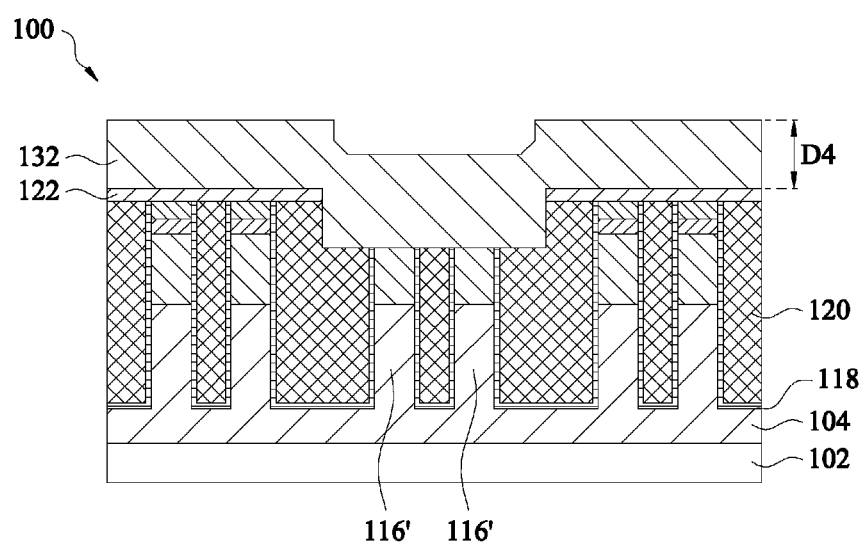
Figure 14:
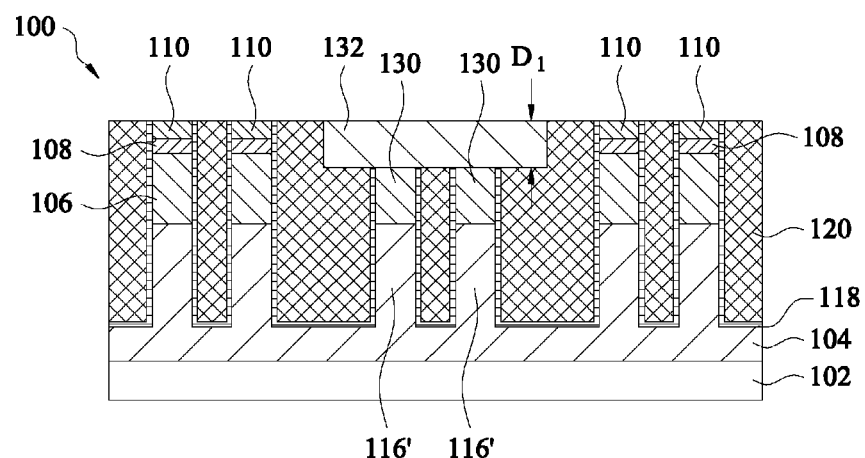
Figure 15:
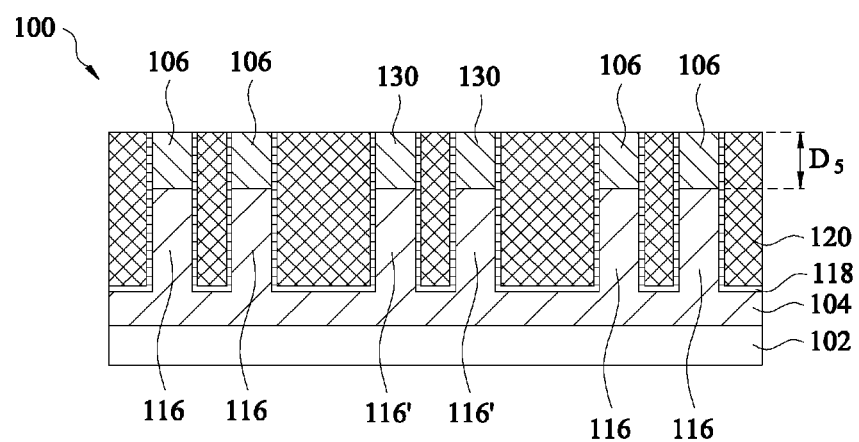
Figure 16:
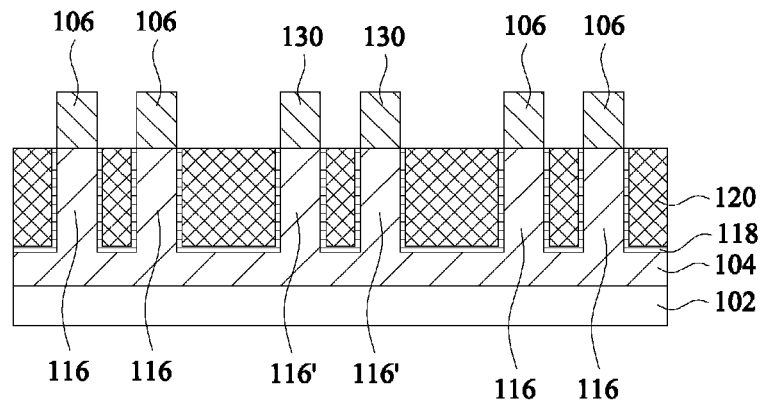

FIGS. 13 through 15 illustrate further process steps to level top surfaces of n-type semiconductor strips 106 and p-type semiconductor strips 130. Referring to FIG. 13, a sacrificial layer 132 is blanket deposited over a top surface of wafer 100. In some embodiments, sacrificial layer 132 comprises a plasma-enhanced oxide (PEOX) deposited using any suitable method, such as CVD, PVD, ALD, and the like. Sacrificial layer 132 may be used to planarize a top surface of wafer 100 and to mitigate the height variation between n-type semiconductor strips 106 and p-type semiconductor strips 130. In some embodiments, sacrificial layer 132 is sufficiently thick to fill (and even overflow) opening 126. For example, sacrificial layer 132 may have a thickness D4 of about 200 nm to about 300 nm. Other dimensions may also be used depending on wafer configuration.

In FIG. 14, a planarization may be performed to remove barrier layer 122 and portions of sacrificial layer 132 extending over pad layer 110. For example, an end-point CMP process may be used to planarize a top surface of wafer 100. During the end-point CMP process, pad layer 110 (e.g., a nitride) may be used as an end point detection layer. During the CMP, sacrificial layer 132 may be used to resist CMP and prevent damage to underlying p-type semiconductor strips 130.

Next, in FIG. 15, a further planarization may be performed to remove pad layer 110, pad layer 108, and sacrificial layer 132. For example, a non-selective CMP process may be used to further planarize wafer 100. In some embodiments, the non-selective CMP process may comprise using a chemical slurry which etches pad layer 110 (e.g., a nitride), pad layer 108/sacrificial layer 132 (e.g., oxides), and n-type semiconductor strips 106/p-type semiconductor strips 130 at a rate of about 1.1 to about 1 to about 0.5, for example.

After planarization, top surfaces of STI regions 120, n-type semiconductor strips 106, and p-type semiconductor strips 130 may be substantially level. It has been observed that by using the various processing steps described above with respect to FIGS. 1 through 15, improved fin height uniformity may be achieved. For example, in fins formed using the above described process steps, a height difference between top surfaces of n-type semiconductor strips 106 and p-type semiconductor strips 130 may be about 3 nm to about 5 nm, while fins formed using other processing methods may exhibit a height difference be about 12 nm to about 22 nm or even more. Furthermore, the use of various barrier layers/sacrificial layers allows for a relatively small amount of non-selective planarization techniques (e.g., non-selective CMP) while still achieving a suitably planar top surface. Thus, the total height of n-type semiconductor strips 106 and p-type semiconductor strips 130 may be maintained at a desired level (e.g., at a desired channel height), which allows for improved device performance and/or reliability in resulting finFETs. For example, in some embodiments, a height of n-type semiconductor strips 106 and p-type semiconductor strips 130 (e.g., distance D5) may be about 40 nm. Other dimensions may also be used depending on wafer configuration.

After the formation of fins 116 and 116' (e.g., comprising semiconductor strips of different types), additional processing may be performed to create finFETs in wafer 100. For example, in FIG. 16, STI regions 120 are recessed, so that top portions of semiconductor strips 106 and 130 are higher than the top surfaces of STI regions 120. The recessing of STI regions 120 may include a chemical etch process, for example, using ammonia ($NH_3$) in combination with hydrofluoric acid (HF) or nitrogen trifluoride ($NF_3$) as reaction solutions either with or without plasma. When HF is used as the reaction solution, a dilution ratio of HF may be between about 1:50 to about 1:100.

Channel regions of two different types (e.g., corresponding to n-type semiconductor strips 106 and p-type semiconductor strips 130) are thus formed in fins 116/116'. In the completed finFET structures, one or more gate stacks wrap around and covers sidewalls of such channel regions (see FIG. 17). The resulting structure is shown in FIG. 17. For example, referring to FIG. 17, gate stacks are formed on the top surface and the sidewalls of semiconductor strips 106 and 130. Such gate stacks may include a gate dielectric 152 and a gate electrode 154.

In accordance with some embodiments, gate dielectric 152 includes silicon oxide, silicon nitride, or multilayers thereof. In alternative embodiments, gate dielectric 152 includes a high-k dielectric material. In such embodiments, gate dielectric 50 may have a k value greater than about 7.0, and may include a metal oxide or a silicate of hafnium (Hf), aluminum (Al), zirconium (Zr), lanthanum (La), magnesium (Mg), barium (Ba), titanium (Ti), lead (Pb), and combinations thereof. The formation methods of gate dielectric 152 may include molecular beam deposition (MBD), ALD, plasma enhanced CVD (PECVD), or the like. Gate electrode 154 is formed over gate dielectric 152 and may include a metal-containing material such as titanium nitride (TiN), tantalum nitride (TaN), tantalum carbon (TaC), colbalt (Co), ruthenium (Ru), aluminum (Al), combinations thereof, or multi-layers thereof, for example.

Thus, NMOS finFETS 200 and PMOS finFETS 202 may be formed in wafer 100 having substantially level channel regions (e.g., n-type semiconductor strips 106 and p-type semiconductor strips 130). Although not explicitly illustrated, the formation of finFETS 200 and 202 may include additional processing steps including, without limitation, the formation of various dummy gate features prior to gate dielectric 153/gate electrode 154, the replacement of portions of semiconductor strips 106/130 (e.g., portions not covered by dummy gate structures) with epitaxially grown source/drain regions doped with p-type impurities (e.g., boron or $BF_2$) or n-type impurities (e.g., phosphorus or arsenic) appropriate type (see e.g., FIG. 1), the formation of gate spacers on sidewalls of gate electrode 154, source/drain and/or gate contacts, and the like. Furthermore, while wafer 100 illustrates a particular configuration of NMOS finFETs 200 and PMOS finFETS 202, other configurations may be formed in alternative embodiments depending on device configuration.

FIG. 18 illustrates an example process flow 300 for forming finFETs in accordance with some embodiments. In step 302, a first fin (e.g., fin 116) and a second fin (e.g., fin 116') are formed in a wafer. The first fin includes a first semiconductor strip (e.g., semiconductor strip 106) and a first pad nitride layer portion (e.g., pad layer portion 110) over the first semiconductor strip, the second fin includes a second semiconductor strip (e.g., semiconductor strip 106') and a second pad nitride layer portion (e.g., pad layer portion 110') over the second semiconductor strip. The first and second semiconductor strips may be of a same type (e.g., either n-type or p-type). Furthermore, the first and second fins may extend upwards from a semiconductor substrate (e.g., SRB layer 104), and thus, the first and second fins may further include a first SRB layer portion and a second SRB layer portion, respectively.

In step 304, a barrier layer (e.g., barrier layer 122) may be blanket deposited over the wafer. In some embodiments, the barrier layer may be deposited over the first and second pad nitride layer portions, and the barrier layer may comprise a different material (e.g., an oxide) than the pad layer portions. In step 306, the barrier layer patterned to expose the second fin (e.g., the second pad nitride layer portion of the second fin) while masking the first fin.

Continuing on to steps 308 through 312, the second semiconductor strip is replaced with a third semiconductor strip. The barrier layer may mask the first semiconductor fin while the second semiconductor strip is replaced. In step 308, the second semiconductor strip and the second pad nitride layer portion are removed. In step 310, a third semiconductor strip (e.g., semiconductor strip 130) is epitaxially grown in the second fin. For example, the third semiconductor strip may be epitaxially grown over a SRB layer portion of the second fin. The third semiconductor strip may be of a different type than the first semiconductor strip. For example, when the first semiconductor strip is n-type, the third semiconductor strip may be p-type and vice versa. Epitaxially growing the third semiconductor strip may include growing the third semiconductor strip over top surfaces of adjacent features (e.g., STI regions 120). Thus, in step 312, a selective CMP is performed to planarize the third semiconductor strip. The selective CMP may include using a chemical slurry that planarizes the third semiconductor strip at a faster rate than the barrier layer. In step 314, after performing the selective CMP, the entire wafer surface is further planarized to remove remaining portions of the barrier layer and the first pad nitride layer. In some embodiments, a sacrificial layer (e.g., sacrificial layer 132) may be deposited to level step height variations between different sections of the wafer (e.g., sections masked and exposed by the patterned barrier layer). After the wafer planarization, top surfaces of the first and second fins may be substantially level.

Various embodiments include a method for forming fins of two different types (e.g., n-type and p-type) over a strain relaxed buffer (SRB) layer and a corresponding structure. The process for forming the fins may include forming fins of a first type (e.g., n-type or p-type) by growing a first semiconductor layer over a SRB layer. Subsequently, he first semiconductor layer in a first subset of fins are is with a second semiconductor layer of a second type (e.g., the other of n-type or p-type). The process may include using various barrier and/or sacrificial layers to protect a second subset of fins while the second semiconductor layer is formed. Thus, fins of two different types may be formed having substantially level top surfaces.

In accordance with an embodiment, a method includes forming a first fin and a second fin over a semiconductor substrate. The first fin includes a first semiconductor strip of a first type, and the second fin includes a second semiconductor strip of the first type. The method further includes replacing the second semiconductor strip with a third semiconductor strip of a second type different than the first type. Replacing the second semiconductor strip includes masking the first fin using a barrier layer while replacing the second semiconductor strip and performing a chemical mechanical polish (CMP) on the third semiconductor strip. Performing the CMP includes using a slurry that planarizes the third semiconductor strip at a faster rate than the barrier layer.

In accordance with another embodiment, a method includes forming a first fin and a second fin extending upwards from a strain relaxed buffer (SRB) layer. The first fin includes a first semiconductor strip and a nitride layer over the first semiconductor strip. The second fin includes a second semiconductor strip. The method further includes forming an oxide layer over nitride layer and the second fin, patterning the oxide layer to expose the second fin while masking the first fin, and replacing the second semiconductor strip with a third semiconductor strip. After replacing the second semiconductor strip, remaining portions of the oxide layer and the first nitride layer are removed.

In accordance with yet another embodiment, a method includes forming a first fin and a second fin in a wafer. The first fin includes a first strain relax buffer (SRB) layer portion, a first semiconductor strip on the first SRB layer portion, and a first pad nitride layer portion over the first semiconductor strip. The second fin includes a second strain relax buffer (SRB) layer portion, a second semiconductor strip on the second SRB layer portion, and a second pad nitride layer portion over the second semiconductor strip. A barrier layer is blanket deposited on a top surface of the wafer, wherein the barrier layer is disposed over the first pad nitride layer portion and the second pad nitride layer portion. The method further includes removing the second pad nitride portion and the second semiconductor strip, epitaxially growing a third semiconductor strip over the second SRB layer portion, and performing a selective chemical mechanical polish (CMP) on the third semiconductor strip. Performing the selective CMP includes using a slurry that selectively planarizes the third semiconductor strip at a higher rate than the barrier layer. After performing the selective CMP, removing remaining portions of the barrier layer and the first pad nitride layer to expose the first semiconductor strip.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a fin field effect transistor (finFET) comprising:
   forming a first fin over a semiconductor substrate, the first fin comprising a first semiconductor strip of a first type;
   forming a second fin over the semiconductor substrate, the second fin comprising a second semiconductor strip of the first type; and
   replacing the second semiconductor strip with a third semiconductor strip of a second type different than the first type, wherein replacing the second semiconductor strip comprises:
     masking the first fin using a barrier layer while replacing the second semiconductor strip; and
     performing a chemical mechanical polish (CMP) on the third semiconductor strip using a slurry that planarizes the third semiconductor strip at a faster rate than the barrier layer; and
   forming one or more shallow trench isolation (STI) regions between the first fin and the second fin, wherein masking the first fin further comprises masking a first portion of the one or more STI regions and exposing a second portion of the one or more STI regions.

2. The method of claim 1, wherein the first fin further comprises a pad nitride layer over the first semiconductor strip, wherein the barrier layer comprises an oxide, and wherein masking the first fin comprises forming the barrier layer over the pad nitride layer.

3. The method of claim 1, wherein replacing the second semiconductor strip further comprises recessing a first top surface of the second portion of the one more STI regions from a second top surface of the first portion of the one or more STI regions.

4. The method of claim 3, wherein performing the CMP comprises planarizing a third top surface of the third semiconductor strip to be substantially level with the first top surface, and wherein the method further comprises:
   blanket depositing a sacrificial layer over the first top surface, the second top surface, and the third top surface;
   performing a first planarization to remove an upper portion of the sacrificial layer, wherein the first planarization exposes the first top surface; and
   performing a second planarization to remove a lower portion of the sacrificial layer, wherein the second planarization exposes the third top surface.

5. The method of claim 4, wherein after performing the second planarization, the third top surface is substantially level with a fourth top surface of the first semiconductor strip.

6. The method of claim 4, wherein after performing the first planarization, the barrier layer is removed.

7. The method of claim 1, wherein forming the first fin and forming the second fin comprises forming the first fin and forming the second fin on a strain relax buffer (SRB) layer.

8. A method for forming a fin field effect transistor (finFET) comprising:
   forming a first fin extending upwards from a strain relaxed buffer (SRB) layer, wherein the first fin comprises a first semiconductor strip and a first nitride layer over the first semiconductor strip;
   forming a second fin extending upwards from the SRB layer wherein the second fin comprises a second semiconductor strip;
   forming an oxide layer over the first nitride layer and the second fin;
   patterning the oxide layer to expose the second fin while masking the first fin;
   replacing the second semiconductor strip with a third semiconductor strip;
   forming a sacrificial layer over the third semiconductor strip; and
   removing the sacrificial layer, remaining portions of the oxide layer, and remaining portions of the first nitride layer.

9. The method of claim 8, wherein the second fin comprises a second nitride layer, and wherein replacing the second semiconductor strip comprises:
   removing the second nitride layer;
   removing the second semiconductor strip; and
   epitaxially growing the third semiconductor strip.

10. The method of claim 9, wherein replacing the second semiconductor strip further comprises performing a pre-cleaning to remove a native oxide from the SRB layer after removing the second semiconductor strip.

11. The method of claim 8, wherein the second fin is disposed adjacent a shallow trench isolation (STI) region, wherein patterning the oxide layer exposes a first portion of the STI region, and wherein replacing the second semiconductor strip further comprises recessing a top surface of the first portion of the STI region from a top surface of the first fin.

12. The method of claim 8, wherein replacing the second semiconductor strip further comprises selectively planarizing the third semiconductor strip using a chemical mechanical polish (CMP) process, and wherein the CMP process comprises using a slurry that provides a first removal rate for material of the third semiconductor strip and a second removal rate for material of the oxide layer, the first removal rate greater than the second removal rate.

13. The method of claim 8, wherein
   the sacrificial layer is formed over the first fin and the second fin, and removal of the sacrificial layer, remaining portions of the oxide layer, and remaining portions of the first nitride layer further comprises:
   performing a first planarization to remove upper portions of the sacrificial layer and remaining portions of the oxide layer, wherein the first nitride layer is an endpoint of the first planarization; and
   performing a second planarization to remove the first nitride layer and lower portions of the sacrificial layer, wherein after performing the second planarization, top surfaces of the first semiconductor strip and the second semiconductor strip are substantially level.

14. The method of claim 8, wherein forming the first fin and forming the second fin comprises doping the first semiconductor strip and the second semiconductor strip with n-type or p-type dopants, and wherein replacing the second semiconductor strip in the second fin with a third semiconductor strip comprises doping the third semiconductor strip with dopants of a different type than the first semiconductor strip.

15. A method comprising:
forming a first fin in a wafer, wherein the first fin comprises:
a first strain relax buffer (SRB) layer portion;
a first semiconductor strip on the first SRB layer portion; and
a first pad nitride layer portion over the first semiconductor strip;
forming a second fin in the wafer, wherein the second fin comprises:
a second strain relax buffer (SRB) layer portion;
a second semiconductor strip on the second SRB layer portion; and
a second pad nitride layer portion over the second semiconductor strip;
blanket depositing a barrier layer on a top surface of the wafer, wherein the barrier layer is disposed over the first pad nitride layer portion and the second pad nitride layer portion;
removing the second pad nitride layer portion and the second semiconductor strip;
epitaxially growing a third semiconductor strip over the second SRB layer portion;
performing a selective chemical mechanical polish (CMP) on the third semiconductor strip using a slurry that selectively planarizes the third semiconductor strip at a higher rate than the barrier layer; and
after performing the selective CMP, removing remaining portions of the barrier layer and the first pad nitride layer portion to expose the first semiconductor strip.

16. The method of claim 15, wherein the first semiconductor strip is n-type or p-type, and wherein the third semiconductor strip is of a different type than the first semiconductor strip.

17. The method of claim 15, wherein forming the first fin comprises:
tensilely straining the first fin when the first semiconductor strip is n-type; and
compressively straining first fin when the first semiconductor strip is p-type.

18. The method of claim 17, wherein first semiconductor strip comprises a lower atomic percentage of germanium than the first SRB layer portion when the first fin is tensilely strained.

19. The method of claim 17, wherein first semiconductor strip comprises a higher atomic percentage of germanium than the first SRB layer portion when the first fin is compressively strained.

20. The method of claim 1, wherein the second fin comprises a nitride layer and replacing the second semiconductor strip comprises removing the nitride layer.

* * * * *